United States Patent [19]

Keren

[11] Patent Number: 4,902,973
[45] Date of Patent: Feb. 20, 1990

[54] SEPARATION OF SPECTRAL COMPONENTS

[75] Inventor: Hanan Keren, Kfar Saba, Israel

[73] Assignee: Elscint Ltd., Haifa, Israel

[21] Appl. No.: 172,213

[22] Filed: Mar. 23, 1988

[30] Foreign Application Priority Data

Mar. 27, 1987 [IL] Israel ................................ 82030

[51] Int. Cl.$^4$ ............................................ G01R 33/20
[52] U.S. Cl. .................................... 324/312; 324/307
[58] Field of Search ............... 324/300, 307, 308, 309, 324/310, 311, 312, 313; 128/653

[56] References Cited

U.S. PATENT DOCUMENTS

| | | | |
|---|---|---|---|
| 4,585,993 | 4/1986 | Bottomley | 324/310 |
| 4,654,595 | 3/1987 | Sepponen | 324/307 |
| 4,684,891 | 8/1987 | Feinberg | 324/307 |
| 4,703,267 | 10/1987 | Maudsley | 324/309 |
| 4,739,266 | 4/1988 | Kunz | 324/309 |
| 4,740,748 | 4/1988 | Rzedzian | 324/309 |
| 4,806,866 | 2/1989 | Maier | 324/313 |

OTHER PUBLICATIONS

W. T. Dixon, "Simple Protons Spectroscopic Imaging," Journal of Radiology (vol. 153, 1984, pp. 189–194).
L. Brateman, "Chemical Shift Imaging: A Review," Journal of Radiology, vol. 146, pp. 971–980 (May 1986).

*Primary Examiner*—Michael J. Tokar
*Attorney, Agent, or Firm*—Sandler & Greenblum

[57] ABSTRACT

Separation of spectral components is achieved by acquiring radio frequency (RF) signals using a two dimensional scan sequence wherein the bandwidth of at least one of the RF pulses is less than or equal to the Larmor frequency difference of the spectral components. The slice select gradient pulse applied during the application of the RF pulse of limited frequency is smaller than the slice select gradient pulses applied during application of the other Rf pulses.

23 Claims, 4 Drawing Sheets

SEPARATION OF SPECTRAL COMPONENTS

FIELD OF THE INVENTION

This invention is concerned with magnetic resonance imaging (MRI) systems and more particularly with the use of such systems to provide separate images of different spectral components such as water and lipids in different sections of a sample using a single two dimensional multi-slice scan. The single scan is configured to separate the spectral components spatially. This is an improvement over the method and systems described in a patent application which was filed in the United States on Feb. 9, 1988 and received Ser. No. 154,041. Other systems and methods for separating images of spectral components are described in two previous patent applications, one of which was filed in the United States on Aug. 4, 1986 having the Ser. No. 892,105 which issued as U.S. Pat. No. 4,714,885 on Dec. 22, 1987, and the second of which was filed in the United States on Nov. 25, 1987, having the Ser. No. 125,533. All three of these previous patent applications are assigned to the assignee of this invention.

BACKGROUND OF THE INVENTION

It is important to be able to remove certain spectral components from an image while leaving other spectral components. For example, in imaging of the eye by the usual magnetic resonance imaging (MRI) techniques, the optical nerve itself is covered by a layer of fat which obstructs the observation of the naked optical nerve. If the fat can be removed and just the water component of the image remains, then, a clear view is obtained of the optical nerve.

Also, at present, separate images of two different spectral components such as water and lipids within the patient are sometimes obtained. The separate images are important for diagnostic purposes; since, they supply the user with chemical information in addition to the morphological and anatomical information of conventional imaging.

Moreover by using an appropriate shift of one image in respect to the other, the two images can be combined in a manner which results in an image free of chemical shift artifacts. Presently, without taking proper steps, artifacts are caused by the different resonant frequencies of spectral components. For example hydrogen in fat has a different Larmor frequency than hydrogen in water. The Larmor frequency differences cause what are known as chemical shift artifacts.

A unique pair of inter-related sequences to obtain information on water and liquids in a patient was described in an article appearing in the Journal of Radiology entitled "Simple Protons Spectroscopic Imaging" by W. T. Dixon (Vol. 153, 1984, pp 189–194). In that article a method for encoding spectroscopic information and to obtain clinical images is explained. The image produced differentiates between the water and fat intensities. The differentiation is done spectrally. The first two patent applications noted hereinbefore are improvements on the Dixon et al method and also distinguish the water and fat components or in general spectral components spectrally. Disadvantages in the use of methods which spectrally differentiate between spectral components or chemically differentiated components are that a high degree of homogeneity of the field is required; or in the absence of the high degree of homogeneity, field maps are required showing the exact inhomogeneity of the magnetic field used during the test.

A review article entitled "Chemical Shift Imaging: A Review by L. Brateman" appeared in the American Journal of Radiology, volume 146, pp 971–980 (May 1986). It surveyed the prior art methods of chemical shift imaging which is defined in the article as "determining the spatial distribution of nuclei with a particular resonance frequency, such as water protons, rather than imaging the entire spectrum of resonance frequencies within a body".

Another method not directly related to the Dixon method is a chemical shift selection saturation method (see noted Brateman article and method 3). This too, however, requires a high degree of homogeneity or exact measurement of the imhomogeneity of the field in which the tests are conducted. The degree of homogeneity required has not been obtained in actual working systems. Phase mapping is time consuming and accordingly it is desirable to avoid the necessity of phase mapping and nonetheless, to provide data for separately imaging spectral components in the subjects being imaged.

In addition the prior art chemical shift imaging of the noted articles has required a relatively high power deposition. Systems and methods that reduce power deposition are desired.

BRIEF DESCRIPTION OF THE INVENTION

According to a broad aspect of the present invention, a method of using MRI systems for acquiring spatially separated image data contributions of a selected one of first and second spectral components during a single scan of selected portions of a sample is provided, said method comprising the steps of:

exciting the first and second spectral components to cause the first and second spectral components to generate first and second signals of different frequencies which are spatially separated, and converting a selected one of said spatially separated first and second signals to image data for obtaining an image.

According to another aspect of the present invention, a method of using MRI systems for acquiring spatially separated image data contributions derived from first and second spectral components respectively during a single scan of selected portions of samples is provided, said image data having X, Y coordinate defined areas corresponding to spatially defined sections in a selected plane perpendicular to the Z axis, said method comprising the steps of:

acquiring RF signals using a two dimensional scan sequence, said acquiring step including:

applying RF pulses in said two dimensional scan sequence wherein the bandwidth of one of the RF pulses is less than or equal to the Larmor frequency difference of the spectral components, using slice select gradient pulses during said one of the RF pulses that are smaller than the slice select gradient pulses used during application of the other RF pulses to select a slice that includes RF signals from only one spectral component, using a two dimensional Fourier transform method for obtaining data from said RF signals from only one spectral component for storage in corresponding areas of a matrix; said matrix being spatially divided into X, Y defined areas containing only data of said one spectral component.

Accordingly, the display from the acquired RF signals provides a display of selected first spectral components separated from the display of second spectral components. The RF signals are acquired in a single scan.

In the past, to minimize or eliminate the chemical shift artifacts, it has been customary to use RF pulses during the scan sequence wherein the bandwidth of the pulses encompasses the resonant frequencies of both spectral components. The invention herein minimizes chemical shift artifacts by using at least one radio frequency pulse having a bandwidth that is between the resonant frequencies of each of the spectral components and to simultaneously use a smaller slice selecting gradient pulse to thereby excite only one of the spectral components to generate RF signals in a given slice. Subsequently, the signals from the selected spectral component are processed using two dimensional fast Fourier transform operations to obtain image data.

A feature of the invention comprises repeating the sequence but selecting the other component and then combining the images of the individual spectral components to provide a combined image without chemical shift artifacts.

According to another feature of the invention the spectral components are water and lipids. The strength of the large static magnetic field is in the order of 2 Tesla whereby the bandwidth utilized is 300 Hz or less.

According to another feature of the invention, a first surview image is acquired and the region of interest (ROI) is selected to have either a pure fat image or a pure water image. This can be done since the water and fat are spatially separated (by pixels) rather than by frequency. After selecting the ROI, then the 2-D acquisition and reconstruction are accomplished. In this manner the display, for example, of the eye is presented purely as a water image, so that the optical nerve is not covered by fat.

In different pathologies it is important to examine the fat content of the particular ROI under investigation. For example, in diagnosing fat infiltration of the liver it is important to look at the amount of fat in the liver. This can be done by selecting the protocol so that the image of the liver is within the water portion of the image. Then by moving the RF signal's resonant frequency, the fat portion of the liver is imaged. In that manner, one is able to determine the percentage amount of fat in the liver. A similiar situation arises with fats within muscles, in general, such as for example in the heart. In all such situations it is extremely important to be able to efficiently separate the water and fat portions of the image without extensive inhomogeneity maps or to combine separate fat and water images of the same sections of the body to obtain chemical shift artifact free images.

BRIEF DESCRIPTION OF THE DRAWINGS

The above mentioned and additional objects and features of the present invention can be best understood when considered in the light of the following description of a broad aspect of the invention taken in conjunction with the accompanying drawings, wherein.

GENERAL DESCRIPTION

Figure 1:
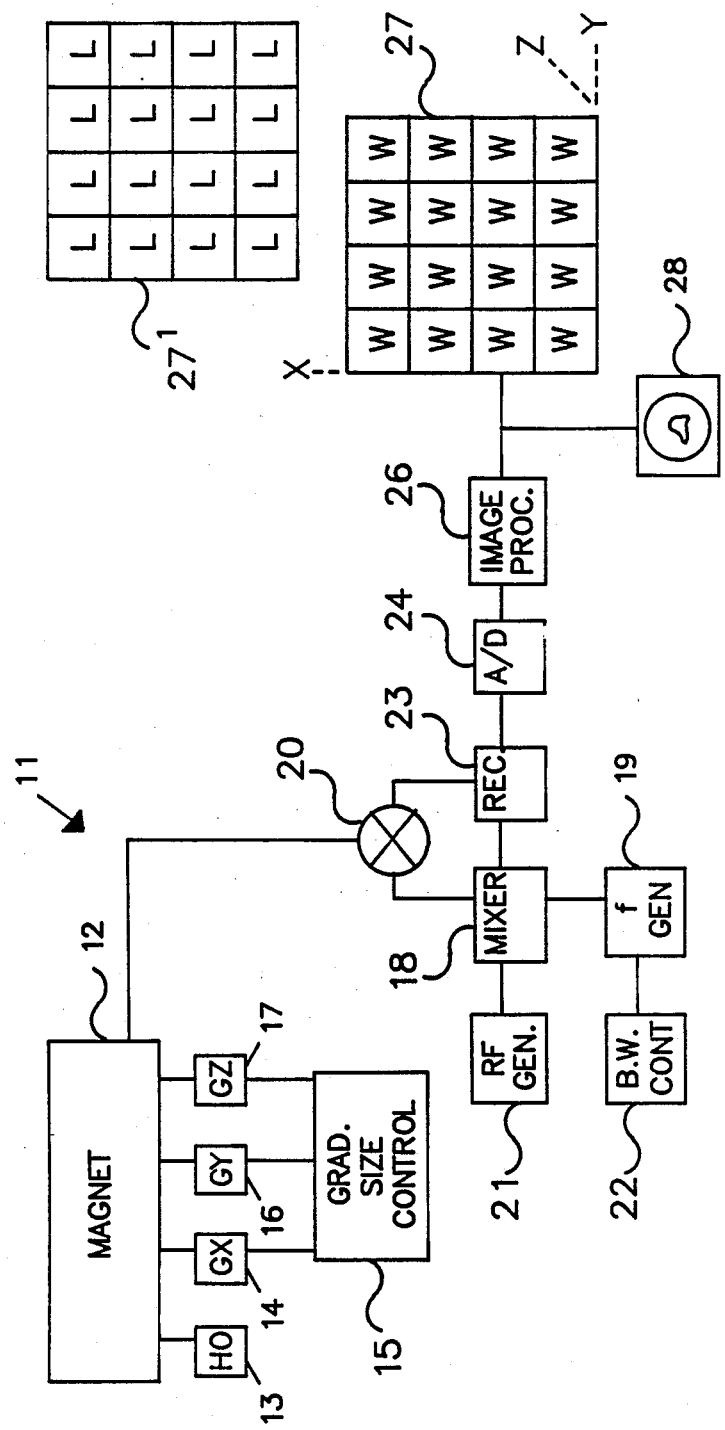
FIG. 1 is an MR data acquisition system including radio frequency pulse bandwidth and gradient amplitude controls according to the invention.

The generalized MRI system 11 shown in FIG. 1 is used for providing images according to magnetic resonance principles. The system includes a large static magnet 12 into which the patient (or samples) are placed. A large static magnetic field can be generated using electromagnets, permanent magnets or super conducting magnets within the scope of this invention. In a preferred embodiment, a superconducting magnet is used. The energization of the superconducting magnet is indicated at 13 by magnetic field generating block Ho.

Means are provided for locating the source of RF signals received during imaging scan sequences. More particularly gradient fields are applied to the static magnetic field. These gradients are applied in the X, Y and Z co-ordinate directions. Gradient generators for applying such gradients are indicated at blocks 14, 16 and 17 labelled Gx, Gy and Gz, respectively. The gradients are used to vary the static magnetic field along X, Y and Z axes and thus provide slice selection, encoding and view selection functions which are well known in the magnetic resonance imaging art.

According to the present invention, means are provided for varying the amplitude of the slice selecting gradient to aid in spatially separating the data acquired from different spectral components. More particularly gradient size control unit 15 is used to provide a lower slice selecting gradient during the application of an RF pulse having a limited bandwidth.

The large static magnetic field causes an alignment of certain nuclear spins in the sample (or patient). Means are provided subsequently for perturbing or tipping the aligned spins by applying RF pulses at the Larmor frequency of the particular nuclei being perturbed. The Larmor frequency is:

$$f_o = \gamma B_o / 2\pi$$

where:

$\gamma$ is the gyromagnetic constant for the isotope whose nuclei is perturbed, $\pi$ is the constant 3.1416+, and $B_o$ is the strength of the static magnetic field at the location of the nuclei.

The RF pulses are obtained from the mixer 18. The mixer in general "mixes" the frequencies obtained from a function generator 19 and an RF generator 21. In accordance with this invention, means such as bandwidth control circuit 22 are provided for varying the bandwidth of the RF pulses by manipulating the function generator output.

The RF pulse shaped by the function generator is sent through switch means 20 to an RF coil or probe, not shown, which subjects the aligned spins in the patient to the RF pulse and tips the spins. Free induction decay (FID) signals generated as a result of the tipped spins are received in the same RF probe or through a separate RF probe. When the same RF probe is used, received signals also go through switch 22 to a receiver 23. Analog to digital (A/D) converter unit 24 is provided for changing the analog signal obtained at receiver 23 to a digital signal. An image processor 26 subjects the digital data received from the A/D unit 24 to two dimensional fast Fourier transformations (2DFFT). The Fourier transformations change view signals and phase encoded signals along the slice selection direction to selected spatially located signals stored in a selected XY matrix, in a well known manner. The XY pixel locations are indicated by the two matrices 27 and 27' separated in the Z direction. The signal data and the location data comprise the image after the Fourier transformations. The image is then displayed on the display unit 28. The matrices 27 and 27' indicates that the image is broken into separate water and fat portions along the Z direction.

Figure 2:
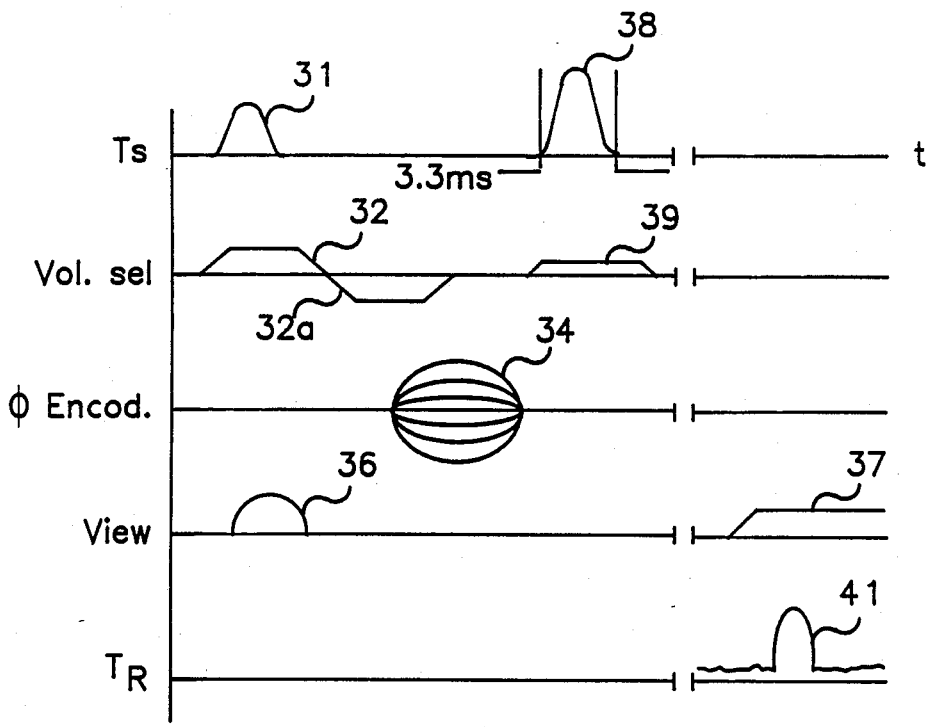
FIG. 2 is a generalized showing of an example data acquisition sequence for use according to the invention for obtaining the spatial separation of the spectral components.

As shown in FIG. 2, a modified spin-echo scan sequence is preferably followed. The normal spin-echo scan sequence is modified by controlling the bandwidths of one of the transmitted RF pulses and using a reduced size slice selecting gradient pulse during the application of the RF pulse with the controlled bandwidth.

The first 90 degree RF pulse indicated at 31 is transmitted during the simultaneous transmital of a slice select gradient pulse 32 which selects a slice of a patient being imaged. The normally used inverted portion 32a of pulse 32 is also shown.

Subsequent to the slice select gradient pulse, a phase encoding gradient pulse is transmitted as indicated at 34. Orthogonal to both prior gradient pulses are the view select gradient pulses, shown as pulse 36 followed by a view select gradient pulse 37 designed to occur during the receipt of the echo signals.

Prior to the receipt of the echo signal, however, a second RF pulse, shown as RF pulse 38, is transmitted. The second RF pulse is designed to move the tipped spins 180 degrees in the plane to which they were tipped. The RF pulse 38 is transmitted during the application of a second slice select gradient pulse 39.

Figure 6:
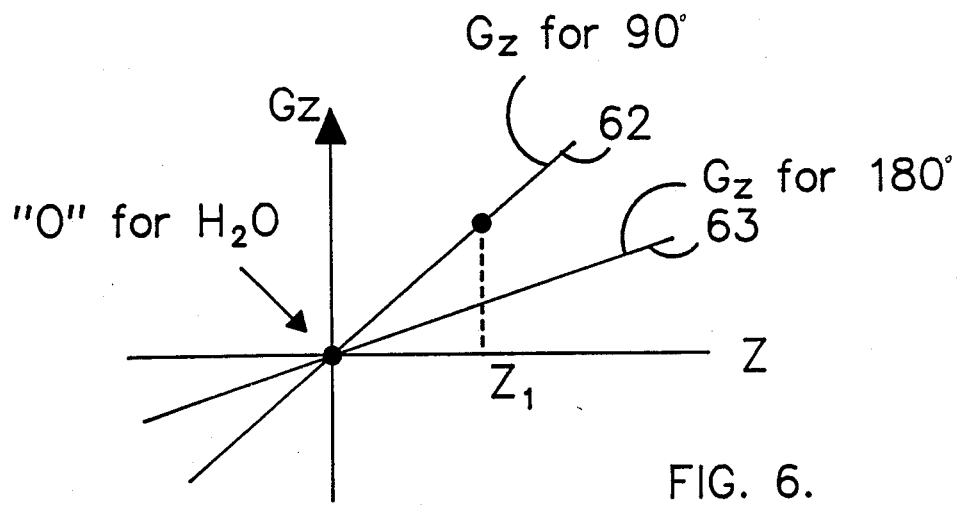
FIG. 6 is a slice select gradient amplitude versus Z axis position graph.
Figure 7:
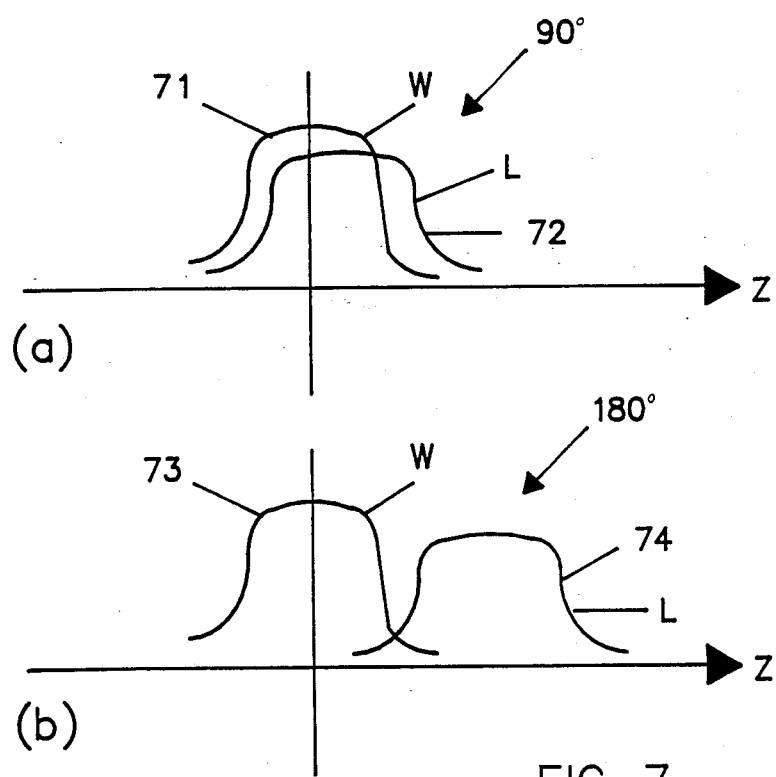
FIGS. 7(a) and 7(b) are showings of slices selected by the "broad band" 90 degree pulse and the "narrow band" 180 degree pulse, respectively, using the slice select gradient shown in FIG. 6.

The slice select gradient pulse 39 is of reduced amplitude as compared to slice select gradient pulse 32. The comparative amplitudes of the slice select gradients are shown in FIG. 6. The lower scope of the gradient 39 aids in spectrally separating water and lipid images, for example, along the view axis, as shown in FIGS. 7(a) and 7(b).

The second RF pulse 38 is limited in bandwidth to be no more than the difference between the Larmor frequencies of the spectral components. In the examplary system described herein fat and water are the spectral components. In the preferred embodiment 3.3 ms is the full width half maximum (FWHM) point of the RF pulses when the high static field is a two Tesla field. The resonant points of the fat and water are separated by 3.5 parts per million (ppm). The Larmor frequency of hydrogen at two tesla is nominally 85 MHz. Accordingly the bandwidth of the 180 degree RF pulse is set so that in the frequency domain, the bandwidth is limited to no more than 300 Hz.

The bandwidth is so limited, according to a preferred embodiment by varying the frequency mixed with the radio frequency. That is, the function which is used to shape the RF pulse is manipulated so that the RF pulse is limited to a bandwidth of 300 Hz in the frequency domain or 3.3 ms in the time domain.

At the delay time TE after the application of the 180 degree pulse, an echo signal, indicated at 41, is received. The receipt, of course, is during the application of the view gradient pulse 37. Subsequently, other echo signals 41 are received after the application of subsequent RF pulses or repetitions of the scan sequence with different phase encoding pulses and/or different viewing pulses.

Figure 3:
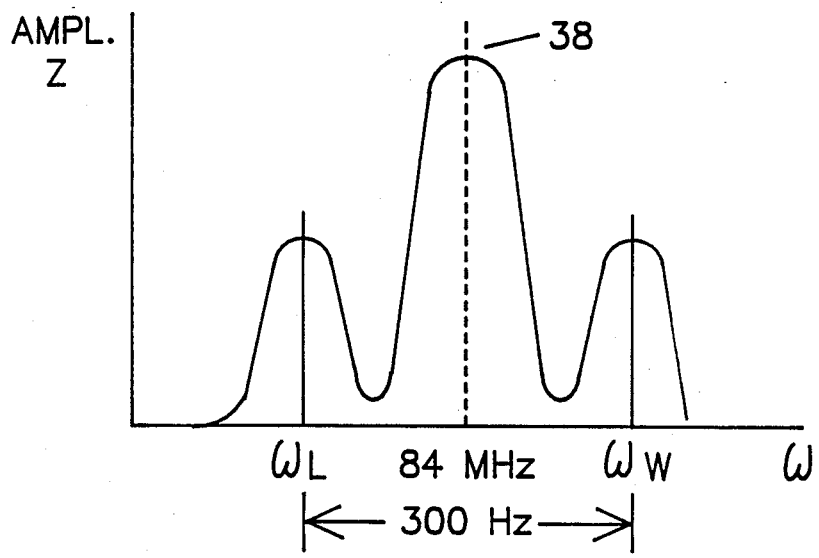
FIG. 3 is a showing of the resonant frequencies of water components and fat components along with the resonant frequency of the 180 degree RF pulse used in the scan sequence of FIG. 2.

FIG. 3 shows an RF pulse in the frequency domain. Therein the RF pulse 38 is shown as having a resonant frequency at about 84 MHz. In this example, the static magnetic field is two Tesla. At this field strength the Larmor frequency of hydrogen in a water molecule and the Larmor frequency of hydrogen in a fat molecule are separated by 300 Hz, as shown in FIG. 3. By limiting the band width of at least one of the RF pulses, it is possible to separate the data received from the hydrogen in fat molecules and the hydrogen in water molecules. As previously indicated, the separated data is spatially separated by the 300 Hz.

In the usual two dimensional fast Fourier transform operation, the acquired wave data is converted to X and Y data along the Z axes. The data from water and fat are spatially separated in the Z direction based on the frequency separation. Thus, the X and Y data are either all water or all lipid as shown in FIG. 1 at 27 and 27'. It is possible to reverse the positions of water and fat; so that the lipid will appear in the first matrix 27 instead of water, for example.

Figure 4A:
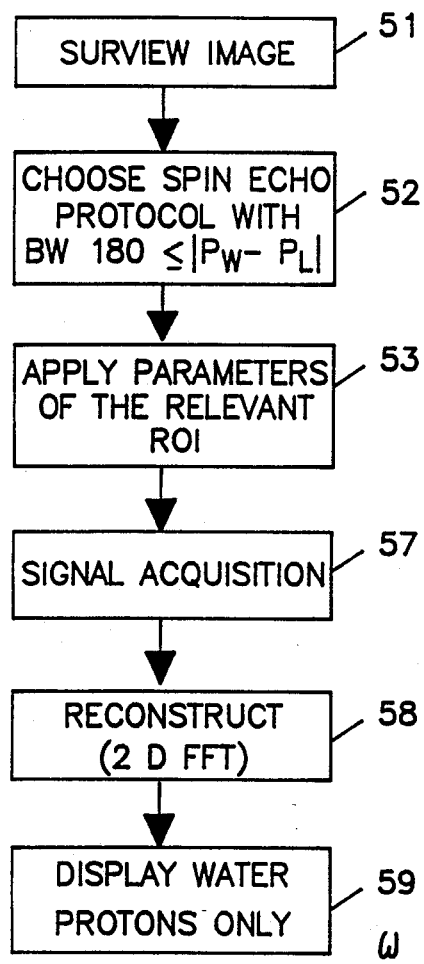
FIGS. 4a, 4b, and 4c are a generalized flow diagram, showing the inventive method in conjunction with display images.

The reversal of water and fat, can be done in different ways. One method is by changing the frequency of the 90 degree RF pulse or by changing the polarity of the slice select gradient applied during the 90 degree RF pulse in the spin-echo data acquisition procedure 57 shown in FIG. 4.

Figure 5:
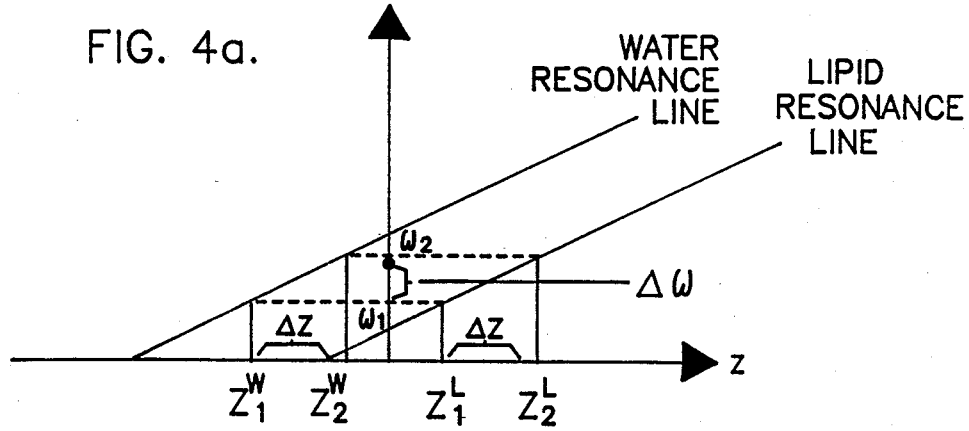
FIG. 5 is a Radian versus Z axis position graph.

FIG. 5 shows how the gradients "project" the bandwidths of the RF pulses to provide spatially separated water and lipid components. In FIG. 5 the bandwidth of at least one of the RF pulses is limited to 300 Hz in a 2 Tesla field, for example, to assure that the water and lipid components do not overlap. This is done to provide spatially separated water and lipid components. In essence the bandwidth is;

$$\Delta f = B_o (\gamma \Phi - \gamma L)$$

where:

$\gamma$ is the gyro-magnetic constant, $B_o$ is the main magnetic field strength, and W,L, are subscripts indicating a proton in a water molecule or a proton in a lipid molecule, respectively.

Figure 4B:
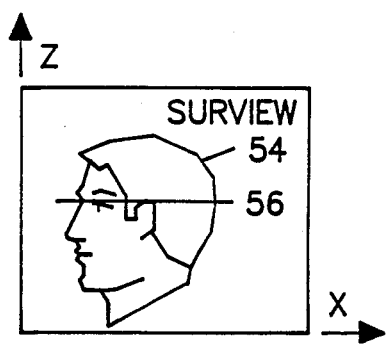
Figure 4C:
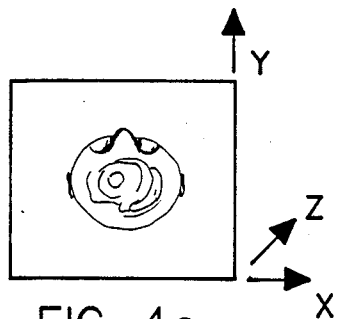

In operation, it is preferred but not essential that first an overview or surview image is obtained. The surview image, for example, is shown in FIG. 4b. The acquisition of the surview image is indicated at block 51 of FIG. 4a. A 2-D spin-echo acquisition protocol is then chosen wherein the bandwidth of the 180 degree radio frequency pulses is less than or equal to the Larmor frequency of hydrogen in water molecule minus the Larmor frequency of hydrogen in fat molecules, as indicated at block 52. The bandwidth of either RF pulse could be limited, in accordance with the present invention. The 180 degree RF pulse is selected to be limited; since the power deposition is determined largely by the 180 degree pulse and limiting the bandwidth reduces the power deposition. Block 53 indicates that parameters are selected to provide an image, indicated in FIG. 4c, of the relevant region or slice desired. As shown in FIGS. 4b and 4c, a slice 54 of the head including the eyes 56 is selected, to eliminate the fat normally covering the optical nerve, for example. After the selection of the desired volume, the spin-echo acquisition procedure is followed as indicated at block 57. After the data is acquired as indicated in block 57, reconstruction using 2-D fast Fourier transforms is done as indicated at block 58. Then the image is displayed as indicated at 59.

The display, as indicated in FIG. 4c is either a slice comprised of pure water data or a slice comprised of pure fat data. The selection of the RF pulse frequency and slice selecting gradient is made so that the pure water portion of the image data covers the optical nerve section of the selected volume of the surview. For example in FIG. 7(a) the 90 degree pulse in conjunction with the slice select gradient 62 (FIG. 6) energizes both water and lipid spins. This is shown by the overlapping received signal data 71 and 72. FIG. 7(b) indicates that the narrow bandwidth 180 degree pulse in conjunction with the gradient 63 (FIG. 6) spread out the received signal data to separate the water and lipid signals as shown by received signal data 73 and 74. The frequency of the received signals as given by:

$$W = W_o + W_i = \gamma B_o + G_z Z_i$$

where:
 $W_o$ is the frequency due to the field B,
 $\gamma$ is the gyromagnetic constant, and
 $W_i$ is the frequency due to the gradient $G_z$ at the location $Z_i$.

If it is decided to show only the fat portion without the water portion then, for example, the frequency of the 90 degree RF pulse is changed so that the spins tipped by the 90 degree RF pulse are spatially aligned with the lipid spins excited by the narrow band 180 degree RF pulse. Simple processing can be used to combine both the water and fat by running a regular spin-echo image sequence without limiting the bandwidth; wherein water and fat data are combined in the usual manner. In that case the bandwidth is made broad enough to encompass both the water and fat portions in the usual manner. Then the fat or water can be subtracted from the total image to minimize the chemical shift artifact. Alternatively and preferably a total image may be obtained by varying the RF pulse frequencies to obtain separate images of the fat and water components. The full image may then be obtained by combining the component images to obtain an artifact free full image; or preferably, an image using data from only one component can reconstructed.

Accordingly, a method is provided wherein water and fat are spatially separated using a regular three dimensional acquisition and reconstruction sequence without being limited by the precise homogeneity of the large static magnetic field.

While the invention is described with regard to specific embodiments, it should be understood that these embodiments are not given as limitations on the scope of the invention but only as examples of the invention.

The invention itself is defined by the accompanying claims.

What is claimed is:

1. A method for separating spectral components in magnetic resonance imaging (MRI) systems, said method comprising the steps of:
    using a spin echo sequence including;
    applying a first radio frequency (RF) pulse to tip spins into a transverse plane where the spins dephase,
    applying a second RF pulse to rephase the spins to form an echo, said first and second RF pulses each having a bandwidth,
    applying a first slice selecting gradient pulse while applying said first RF pulse,
    applying a second slice selecting gradient pulse while applying said second RF pulse,
    limiting the bandwidth of at least one of the applied RF pulses in the spin-echo scan sequence,
    reducing the slice selecting gradient pulse applied while applying the at least one of the applied RF pulses to acquire separated RF signals from each of the spectral components; and
    using a 2-D fast Fourier transform operation for transforming the acquired separated RF signals into image values of a selected one of the spectral components.

2. The method of claim 1 wherein the step of limiting the bandwidth provides a bandwidth that is limited to approximately the difference between the Larmor frequencies of the spectral components.

3. The method of claim 2 wherein the step of limiting provides a bandwidth limited so that the RF signals from the spectral components are slightly overlapped.

4. The method of claim 2 wherein the step of limiting the bandwidths provides limits so that the RF signals from the spectral components abut each other.

5. The method of claim 1 wherein the step of limiting the bandwidth of the applied RF pulses provides signals from the spectral components that are spatially separated from each other.

6. The method of claim 5 including the step of converting the spatially separated values into display images.

7. A method for separating images of first and second spectral components using magnetic resonance imaging (MRI) systems, said method including the steps of:
    using a scan sequence,
    exciting the first and second spectral components with a first RF pulse in the presence of a first slice-selecting gradient pulse to cause the first and the second spectral components that are substantially at a same spatial two dimensional location to generate first and second RF signals,
    exciting the first and second spectral components with a second RF pulse in the presence of a second slice selecting gradient to cause the first and second spectral components to generate third and fourth RF signals of different frequencies, which are spatially separated, but wherein said first, second and third RF signals are substantially from the same location.

8. The method of claim 7 wherein said step of exciting includes applying at least one RF pulse having a limited bandwidth.

9. The method of claim 8 wherein the second RF pulse has the limited bandwidth, and wherein the second slice selecting gradient is smaller than said first slice selecting gradient.

10. The method of claim 8 wherein the bandwidth of the RF pulse that is limited is limited to be less than or equal to the Larmor frequency differences of the spectral components in the system.

11. The method of claim 10 including using RF pulse frequencies and slice selecting gradients to obtain separate images of both spectral components and combining the images of the individual spectral components to provide a combined image without chemical shift artifacts.

12. The method of claim 8 wherein said spectral components are water and lipids, the static field of the MRI system is two Tesla and said bandwidth is 300 Hz.

13. A system for separating images of spectral components using magnetic resonance imaging (MRI) systems, comprising:
   means for performing a scan sequence, including:
   magnet means for aligning spins in a subject,
   means for applying a first radio frequency (RF) pulse to tip the aligned spins into a transverse plane where the spins dephase,
   means for applying a second RF pulse to rephase said dephased spins to form an RF signal, said first and said second RF pulse each having a bandwidth.
   means for applying a first slice selecting gradient pulse at the time of applying the first RF pulse and a second slice selecting gradient pulse at the time of applying the second RF pulse,
   means for limiting the bandwidth of at least one of the applied RF pulse in the scan sequence,
   means for changing the slice selecting gradient during the application of the at least one of the applied RF pulses to acquire separate RF signals from the spectral components; and
   means for doing a 2-D fast Fourier transform operation for transforming the acquired separated RF signals of only one of the spectral components into separated image values.

14. The system of claim 13 wherein the means for limiting the bandwidth limits the bandwidth to approximately the difference between the Larmor frequencies of the spectral components.

15. The system of claim 14 wherein the means for limiting the bandwidth provides a bandwidth that is limited so that the RF signals from the spectral components slightly overlap.

16. The system of claim 14 wherein the means for limiting the bandwidth limits the bandwidth so that the signals from the two spectral components abut each other.

17. The system of claim 14 wherein the means limiting the bandwidth provides signals from the spectral components that are spatially separated from each other.

18. The system of claim 17 including means for converting the spatially separated signals into display images.

19. A system for separating images of spectral components using MRI systems, said system including:
   means for exciting first and second spectral components to generate first and second RF signals which are from the same spatial location, and
   means for exciting said first and second spectral components to generate third and fourth RF signals which are spatially separated with said first, second and third RF signals being from the same spatial location.

20. The system of claim 19 wherein the means for exciting includes means for applying at least one RF pulse having a limited bandwidth in the presence of a slice selecting gradient of reduced amplitude.

21. The system of claim 20 including means for acquiring image data contributions derived from the first spectral component during a single scan.

22. The system of claim 21 wherein the means for acquiring includes means for using said RF pulse in said scan sequence wherein the bandwidth of the RF pulses is limited to be less than or equal to the Larmor frequency difference of the spectral components in the system, and
   means for applying a two dimensional Fourier transform for obtaining data from said RF signals for storage in a Z matrix, said Z matrix containing only data of said first spectral component.

23. The system of claim 22 including means for obtaining an image of the second spectral component and means for combining the images of the individual spectral components to provide a combined image without chemical shift artifacts.

* * * * *